United States Patent
Okamoto et al.

(10) Patent No.: US 10,097,157 B2
(45) Date of Patent: Oct. 9, 2018

(54) CRYSTAL VIBRATING DEVICE AND METHOD FOR PRODUCING THE SAME

(71) Applicant: Murata Manufacturing Co., Ltd., Nagaokakyo-shi, Kyoto-fu (JP)

(72) Inventors: Bunta Okamoto, Nagaokakyo (JP); Motoyoshi Sakai, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 476 days.

(21) Appl. No.: 14/920,419

(22) Filed: Oct. 22, 2015

(65) Prior Publication Data

US 2016/0043702 A1 Feb. 11, 2016

Related U.S. Application Data

(63) Continuation of application No. PCT/JP2014/061292, filed on Apr. 22, 2014.

(30) Foreign Application Priority Data

May 1, 2013 (JP) ................. 2013-096194

(51) Int. Cl.
  *H01L 41/053* (2006.01)
  *H03H 9/10* (2006.01)
  *H03H 9/05* (2006.01)
  *H03H 3/02* (2006.01)
  *H03H 9/17* (2006.01)

(52) U.S. Cl.
  CPC ........... *H03H 9/10* (2013.01); *H03H 3/02* (2013.01); *H03H 9/0509* (2013.01); *H03H 9/1021* (2013.01); *H03H 9/17* (2013.01)

(58) Field of Classification Search
  CPC ...... H03H 3/02; H03H 9/0509; H03H 9/1021; H03H 9/17; H03H 9/10; H01L 41/09
  USPC ................................. 310/348, 349, 365
  See application file for complete search history.

(56) References Cited

U.S. PATENT DOCUMENTS 8,541,928 B2 9/2013 Shimao et al.

FOREIGN PATENT DOCUMENTS

| CN | 101478297 A | 7/2009 |
|---|---|---|
| JP | 2000-013178 A | 1/2000 |
| JP | 2001-274653 A | 10/2001 |
| JP | 2003-168950 A | 6/2003 |

(Continued)

OTHER PUBLICATIONS

International Search Report issued for PCT/JP2014/061292, dated Jul. 22, 2014.

(Continued)

*Primary Examiner* — Thomas Dougherty
(74) *Attorney, Agent, or Firm* — Arent Fox LLP

(57) ABSTRACT

A crystal vibrating device that includes a crystal resonator mounted on a substrate by a first conductive adhesive layer and a second conductive adhesive layer, and, when the first conductive adhesive layer and the second conductive adhesive layer are viewed in a plan view, the first conductive adhesive layer and the second conductive adhesive layer each have a) a planar shape in which two circles or ellipses are partly superimposed upon each other, b) two conductive adhesive layer portions that are separated from each other, or c) a length direction and an aspect ratio, which is a ratio between a maximum size in the length direction and a maximum size in a width direction that is orthogonal to the maximum size in the length direction, is in a range of 1.5 to 3.0.

10 Claims, 8 Drawing Sheets

(56) References Cited

FOREIGN PATENT DOCUMENTS

| | | | |
|---|---|---|---|
| JP | 2003-224443 | A | 8/2003 |
| JP | 2003-224447 | A | 8/2003 |
| JP | 2004-088524 | A | 3/2004 |
| JP | 2004-357131 | A | 12/2004 |
| JP | 2005-039344 | A | 2/2005 |
| JP | 2008-109538 | A | 5/2008 |
| JP | 2009-117902 | A | 5/2009 |
| JP | 2009105779 | A | 5/2009 |
| JP | 2009-124370 | A | 6/2009 |
| JP | 2013-021667 | A | 1/2013 |

OTHER PUBLICATIONS

Written Opinion of the International Searching Authority issued for PCT/JP2014/061292, dated Jul. 22, 2014.

CRYSTAL VIBRATING DEVICE AND METHOD FOR PRODUCING THE SAME

CROSS REFERENCE TO RELATED APPLICATIONS

The present application is a continuation of International application No. PCT/JP2014/061292, filed Apr. 22, 2014, which claims priority to Japanese Patent Application No. 2013-096194, filed May 1, 2013, the entire contents of each of which are incorporated herein by reference.

FIELD OF THE INVENTION

The present invention relates to a crystal vibrating device having a structure in which a crystal resonator is supported in a cantilever manner at a crystal resonator mounting surface of a package material. More specifically, the present invention relates to a crystal vibrating device in which a crystal resonator is joined to a package material with a conductive adhesive.

BACKGROUND OF THE INVENTION

Conventionally, crystal vibrating devices have been widely used in portable electronic apparatuses. For example, Patent Document 1 discloses a crystal vibrating device in which a crystal resonator is supported in a cantilever manner in a package. Here, the package includes a container body having an upwardly extending cavity. The cavity of the container body is closed by a cover. Accordingly, the interior of the container body is hollow. The crystal resonator is supported in a cantilever manner on an inside bottom surface of the container body by joining the crystal resonator thereto with a conductive adhesive. In Patent Document 1, a first mounting electrode and a second mounting electrode are provided on the inside bottom surface of the container body. A first extended electrode and a second extended electrode are provided on a bottom surface of the crystal resonator. The first extended electrode and the second extended electrode are electrically to a first excitation electrode and a second excitation electrode. The first extended electrode and the second extended electrode are joined to the first mounting electrode and the second mounting electrode with a conductive adhesive.

Patent Document 1: Japanese Unexamined Patent Application Publication No. 2008-109538

SUMMARY OF THE INVENTION

When conventional crystal vibrating devices such as that described in Patent Document 1 accidentally dropped and shock was applied thereto, vibration frequency changed. In addition, electrically and mechanically joined portions were sometimes broken. That is, a joint between the extended electrodes of the crystal resonator and the conductive adhesive or joints between the conductive adhesive and the mounting electrodes had the possibility of being broken.

In particular, in the crystal vibrating device described in Patent Document 1, the crystal resonator is supported in a cantilever manner. Therefore, an end portion at a side opposite to the side that is secured with the conductive adhesive is a free end. Therefore, application of, for example, dropping shock caused the free end to vibrate, and a large stress was sometimes applied to the side of the joints using the conductive adhesive. Therefore, when dropping shock was applied, vibration frequency had the possibility of being greatly changed as mentioned above.

In order to prevent changes in characteristics or breakage of joints caused by shock such as that mentioned above, the area of joining with a conductive adhesive may be increased. However, when the area of joining with a conductive adhesive is simply increased, the vibration of the crystal resonator is impeded, as a result of which crystal impedance is increased.

It is an object of the present invention to provide a crystal vibrating device that is capable of suppressing, for example, changes in vibration frequency and breakage of electrically and mechanically connected portions caused by, for example, dropping shock without increasing crystal impedance.

According to a broad aspect of the present invention, there is provided a crystal vibrating device including a package material having a crystal resonator mounting surface; a first electrode land and a second electrode land that are provided on the crystal resonator mounting surface of the package material; a crystal resonator that is supported in a cantilever manner at the crystal resonator mounting surface of the package material; and a first conductive adhesive layer and a second conductive adhesive layer that electrically connect and mechanically join the crystal resonator to the respective first electrode land and second electrode land that are provided on the crystal resonator mounting surface of the package material. The crystal resonator includes a crystal element, a first vibrating electrode and a second vibrating electrode that are provided on the crystal element, and a first extended electrode and a second extended electrode that are provided consecutively with the first vibrating electrode and the second vibrating electrode, respectively. The first extended electrode and the second extended electrode are electrically and mechanically connected to the first electrode land and the second electrode land, respectively, by the first conductive adhesive layer and the second conductive adhesive layer, and wherein, when the first conductive adhesive layer and the second conductive adhesive layer are viewed in a plan view, the first conductive adhesive layer and the second conductive adhesive layer each have a planar shape in which two circles or ellipses are partly superimposed upon each other.

According to another broad aspect of the present invention, there is provided a crystal vibrating device including a package material having a crystal resonator mounting surface; a first electrode land and a second electrode land that are provided on the crystal resonator mounting surface of the package material; a crystal resonator that is supported in a cantilever manner at the crystal resonator mounting surface of the package material; and a first conductive adhesive layer and a second conductive adhesive layer that electrically connect and mechanically join the crystal resonator to the respective first electrode land and second electrode land that are provided on the crystal resonator mounting surface of the package material. The crystal resonator includes a crystal element, a first vibrating electrode and a second vibrating electrode that are provided on the crystal element, and a first extended electrode and a second extended electrode that are provided consecutively with the first vibrating electrode and the second vibrating electrode, respectively. The first extended electrode and the second extended electrode are electrically and mechanically connected to the first electrode land and the second electrode land, respectively, by the first conductive adhesive layer and the second conductive adhesive layer. The first conductive adhesive layer and the second conductive adhesive layer each include two conductive adhesive layer portions that are separated from each other.

According to a different broad aspect of the present invention, there is provided a crystal vibrating device including a package material having a crystal resonator mounting surface; a first electrode land and a second electrode land that are provided on the crystal resonator mounting surface of the package material; a crystal resonator that is supported in a cantilever manner at the crystal resonator mounting surface of the package material; and a first conductive adhesive layer and a second conductive adhesive layer that electrically connect and mechanically join the crystal resonator to the respective first electrode land and second electrode land that are provided on the crystal resonator mounting surface of the package material. The crystal resonator includes a crystal element, a first vibrating electrode and a second vibrating electrode that are provided on the crystal element, and a first extended electrode and a second extended electrode that are provided consecutively with the first vibrating electrode and the second vibrating electrode, respectively. The first extended electrode and the second extended electrode are electrically and mechanically connected to the first electrode land and the second electrode land, respectively, by the first conductive adhesive layer and the second conductive adhesive layer. The first conductive adhesive layer and the second conductive adhesive layer each have a length direction and each have an aspect ratio, which is a ratio between a maximum size in the length direction and a maximum size in a width direction that is orthogonal to the maximum size in the length direction, in a range of 1.5 to 3.0.

In a particular aspect of the crystal vibrating device according to the present invention, the crystal element of the crystal resonator has a shape of a rectangular plate having a pair of long sides and a pair of short sides, a direction in which the short sides extend is a width direction, and the crystal resonator is supported in the cantilever manner at a side of one of the short sides by the first conductive adhesive layer and the second conductive adhesive layer.

In another particular aspect of the crystal vibrating device according to the present invention, a center of gravity of the first conductive adhesive layer and a center of gravity of the second conductive adhesive layer are positioned outwardly in the width direction from a center of the first conductive adhesive layer and outwardly in the width direction from a center of the second conductive adhesive layer.

In still another particular aspect of the crystal vibrating device according to the present invention, the planar shape of each of the first conductive adhesive layer and the second conductive adhesive layer extends from the short side towards a center side of the crystal element from an inner side to an outer side in the width direction.

In still a different particular aspect of the crystal vibrating device according to the present invention, the first electrode land and the second electrode land are thicker at an outer side in the width direction than at an inner side in the width direction.

In still a different particular aspect of the crystal vibrating device according to the present invention, a portion of the first conductive adhesive layer and a portion of the second conductive adhesive layer are directly joined to a surface of the crystal element.

In still a different particular aspect of the crystal vibrating device according to the present invention, the first conductive adhesive layer and the second conductive adhesive layer are each formed of epoxy resin and a conductive material.

A producing method according to the present invention includes the steps of:

preparing a package material where a first electrode land and a second electrode land are formed on a crystal resonator mounting surface;

preparing a crystal resonator including a crystal element, a first vibrating electrode and a second vibrating electrode that are provided on the crystal element, and a first extended electrode and a second extended electrode that are formed consecutively with the first vibrating electrode and the second vibrating electrode, respectively, the first extended electrode and the second extended electrode each having a portion that reaches a bottom surface of the crystal element; and mounting the crystal resonator on the crystal resonator mounting surface of the package material by joining the first and second extended electrodes to the first electrode land and the second electrode land of the package material with a first conductive adhesive and a second conductive adhesive, respectively.

In the producing method according to the present invention, when joining the crystal element to the first electrode land and the second electrode land at the package material, conductive adhesives are applied to two locations at portions of each of the first conductive adhesive layer and the second conductive adhesive layer.

In the crystal vibrating device according to the present invention, the first conductive adhesive layer and the second conductive adhesive layer have the structures described above. Therefore, even if, for example, dropping shock is applied, changes in vibration frequency are less likely to occur, and breakage of electrically and mechanically joined portions are less likely to break. Therefore, by increasing the area of joining by the conductive adhesive layers, shock resistance can be increased. In addition, since, in the present invention, a joining region is provided so as not to exist at a vibration region, crystal impedance is also less likely to increase.

DETAILED DESCRIPTION OF THE PREFERRED EMBODIMENTS

Figure 1:
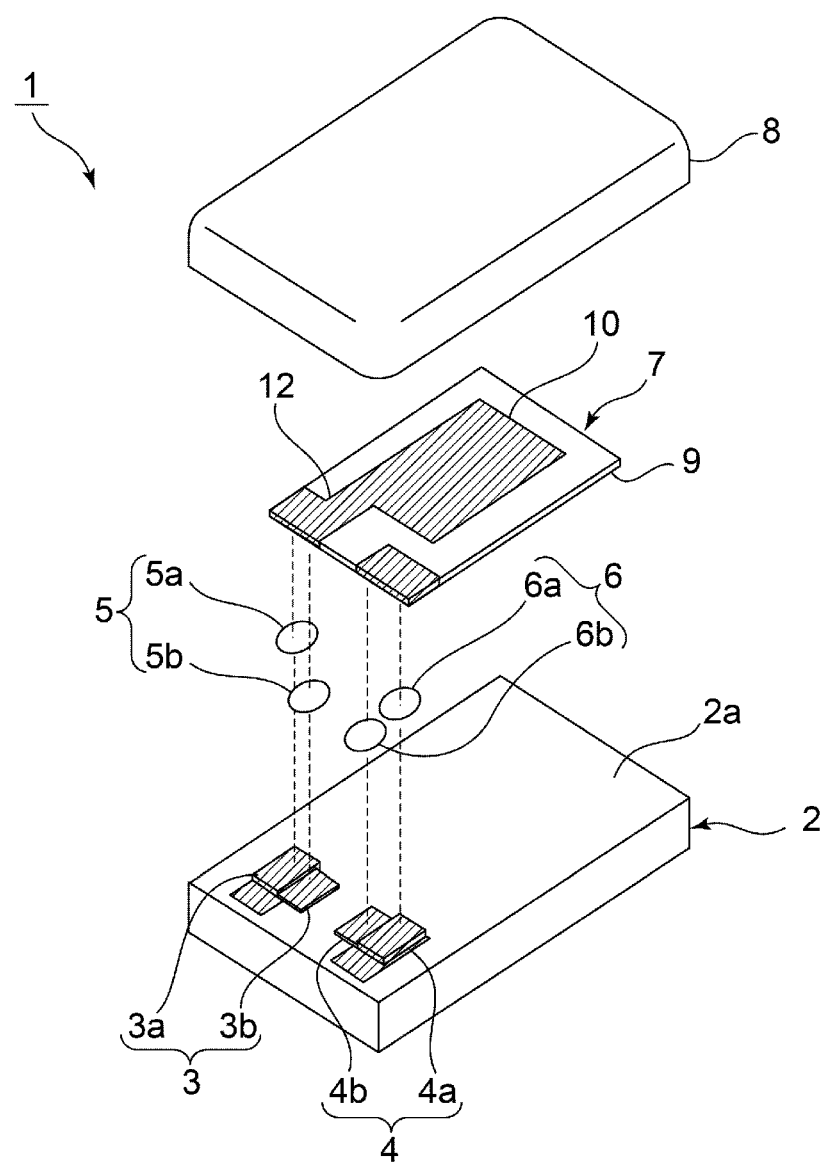
FIG. 1 is an exploded perspective view of a crystal vibrating device according to a first embodiment of the present invention.

The present invention is hereunder made clear by illustrating specific embodiments of the present invention by referring to the drawings.

FIG. 1 is an exploded perspective view of a crystal vibrating device according to a first embodiment of the present invention.

A crystal vibrating device 1 includes a case substrate 2 serving as a package material. A top surface of the case substrate 2 corresponds to a crystal resonator mounting surface on which a crystal resonator (described below) is mounted. In the embodiment, the case substrate is formed of a suitable insulating material such as synthetic resin or insulating ceramics including alumina. A first electrode land 3 and a second electrode land 4 are formed on the crystal resonator mounting surface 2a of the case substrate 2. The first electrode land 3 and the second electrode land 4 are each formed of a suitable metal, such as Au, Ag, Cu, Al, or Ni, or an alloy thereof.

The crystal resonator 7 is supported on the case substrate 2 in a cantilever manner with a first conductive adhesive layer 5 and a second conductive adhesive layer 6. The crystal resonator 7 is surrounded by a cap member 8, and is accommodated in a package. The cap member 8 is formed of a metal. However, the cap member 8 may be formed of a suitable material other than a metal. The cap member 8 has a downwardly extending cavity. Edges of the cavity are joined to the crystal resonator mounting surface 2a of the case substrate 2 with, for example, an insulating adhesive. This forms the package whose interior has a hollow structure.

The crystal resonator 7 includes a crystal element 9. The crystal element 9 has the shape of a rectangular plate. That is, its top surface has a pair of long sides and a pair of short sides. A direction in which the long sides extend corresponds to a length direction. Near one of the short sides, the crystal resonator 7 is supported in a cantilever manner by the first conductive adhesive layer 5 and the second conductive adhesive layer 6. That is, the crystal resonator 7 is supported at a side of the one of the short sides, with a side of the other short side corresponding to a free end.

The first conductive adhesive layer 5 and the second conductive adhesive layer 6 may be formed by using conductive adhesive in which a suitable conductive material is dispersed in a suitable synthetic resin. Desirably, epoxy resin and an epoxy-resin-based conductive adhesive in which a conductive material is dispersed in epoxy resin are used. In this case, it is possible to more sufficiently increase joining strength.

Figure 2:
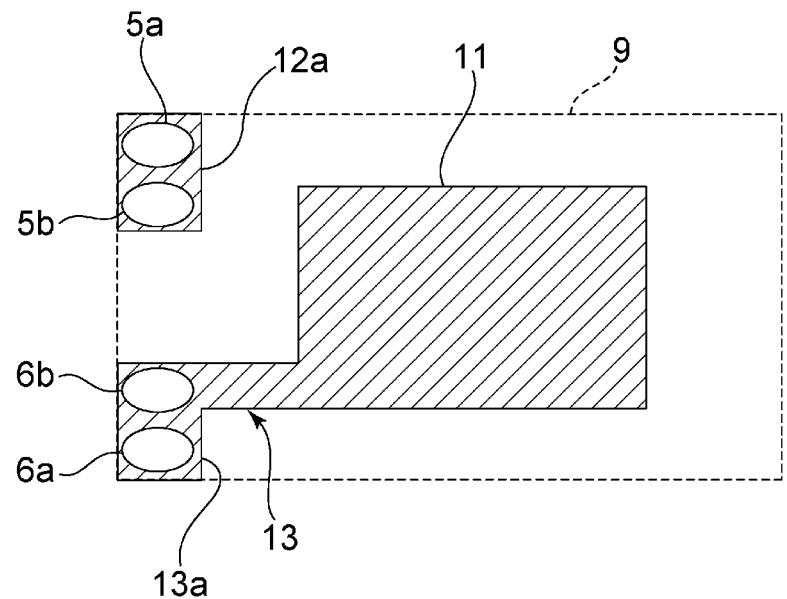
FIG. 2 is a schematic plan view showing, in the crystal vibrating device according to the first embodiment, the shapes of electrodes on a bottom surface of a crystal resonator and the relationship between the positions of first and second conductive adhesive layers when seeing through a crystal element from thereabove.

A first vibrating electrode 10 is formed on a top surface of the crystal element 9. A second vibrating electrode 11 shown in FIG. 2 is formed on a bottom surface of the crystal element 9. The first vibrating electrode 10 and the second vibrating electrode 11 are provided so as to be superimposed upon each other with the crystal element 9 being interposed therebetween. The first vibrating electrode 10 is formed on part of the top surface of the crystal element 9, and the second vibrating electrode 11 is formed on part of the bottom surface of the crystal element 9.

A first extended electrode 12 is formed consecutively with the first vibrating electrode 10. The first extended electrode 12 extends from the top surface of the crystal element 9 to the bottom surface of the crystal element 9 via a side surface at the side of the one of the short sides to a side surface at a side of one of the long sides. That is, an extended electrode portion 12a shown in FIG. 2 is positioned at the bottom surface of the crystal element 9.

A second extended electrode 13 is formed consecutively with the second vibrating electrode 11. The second extended electrode 13 includes an extended electrode portion 13a at the side of the one of the short sides of the crystal element 9. The extended electrode portion 12a and the extended electrode portion 13a are positioned on respective sides in the width direction on the bottom surface of the crystal element 9. The extended electrode portions 12a and 13a correspond with portions that are joined by the conductive adhesive layers 5 and 6, respectively.

As shown in FIG. 1, the crystal resonator 7 is mounted on the crystal resonator mounting surface 2a of the case substrate 2. The case substrate 2 has a rectangular planar shape. The crystal resonator 7 is mounted on the case substrate 2 such that the width direction of the crystal element 9 becomes a width direction of the case substrate 2.

On the crystal resonator mounting surface 2a of the case substrate 2, the first electrode land 3 includes a relatively thick electrode land portion 3a and a relatively thin electrode land portion 3b. The electrode land portion 3a and the electrode land portion 3b are consecutively formed in the width direction, and the electrode land portion 3a is positioned at an outer side in the width direction. Similarly, the second electrode land 4 includes a relatively thick electrode land portion 4a and a relatively thin electrode land portion 4b. The electrode land portion 4a is positioned outwardly from the electrode land portion 4b in the width direction.

The electrode lands 3a, 3b, 4a, and 4b may be formed by, for example, the following method. First, at portions corresponding to the electrode land portions 3a, 3b, 4a, and 4b, conductive pastes are applied and are temporarily solidified. Next, at the portions corresponding to the electrode land portions 3a and 4a, conductive pastes are applied again and are temporarily solidified. Thereafter, the conductive pastes on all of the electrode land portions 3a, 3b, 4a, and 4b are solidified.

The first conductive adhesive layer 5 includes conductive adhesive layer portions 5a and 5b. Here, the conductive adhesive layer portion 5a is positioned at the outer side in the width direction and the conductive adhesive layer portion 5b is positioned at an inner side in the width direction.

Figure 3:
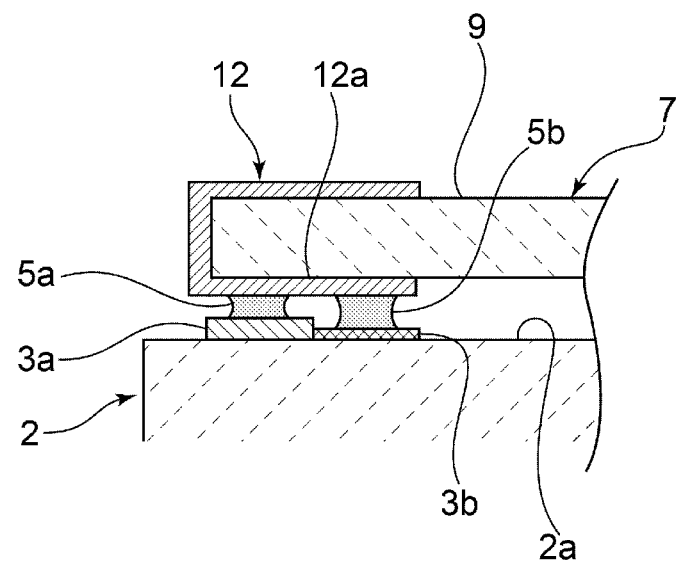
FIG. 3 is a schematic partial cutaway sectional view for illustrating a joined portion using the first conductive adhesive in the crystal vibrating device according to the first embodiment.

The conductive adhesive layer portion 5a joins the electrode land portion 3a of the electrode land 3 to the extended electrode portion 12a of the extended electrode 12. The conductive adhesive layer portion 5b connects the extended electrode portion 12a to the electrode land portion 3b. That is, as shown in FIG. 3, the electrode land portion 3a that is positioned at the outer side 2 in the width direction of the case substrate is joined to the extended electrode portion 12a by the conductive adhesive layer portion 5a.

The electrode lands 3 and 4, the first vibrating electrode 10 and the second vibrating electrode 11, and the first extended electrode 12 and the second extended electrode 13 are each formed of a suitable metal, such as Au, Ag, Cu, Al, or Ni, or an alloy thereof.

In the embodiment, the crystal resonator 7 is mechanically joined to the case substrate 2 by the first conductive adhesive layer 5 and the second conductive adhesive layer 6. The crystal resonator 7 is electrically connected to the electrode lands 3 and 4 by the first conductive adhesive layer 5 and the second conductive adhesive layer 6.

In the embodiment, the first conductive adhesive layer 5 includes the conductive adhesive layer portions 5a and 5b. The second conductive adhesive layer 6 includes the conductive adhesive layer portions 6a and 6b. Therefore, the crystal resonator 7 is joined to the case substrate 2 by the conductive adhesive layer portions 5a, 5b, 6a, and 6b and the electrode land portions 3a, 3b, 4a, and 4b at four locations. In the above-described prior art, the crystal resonator is joined to the case substrate by conductive adhesive layers at two locations. In the embodiment, compared to the above-described prior art, it is possible for the area of formation of the conductive adhesive layers to be large, so that, even if stress is applied to a joined portion, the stress is dispersed. Therefore, shock resistance is effectively increased. Thus, when, for example, dropping shock is applied, even if the free end of the crystal resonator 7 that is supported in a cantilever manner is swung, the joined portion is less likely to deteriorate. Consequently, changes in vibration frequency are less likely to occur.

Since shock resistance is increased, it is not necessary to increase the area of adhesion using the conductive adhesive layers 5 and 6. Therefore, crystal impedance is also less likely to increase.

In the embodiment, in the first electrode land 3 and the second electrode land 4, the electrode land portions 3a and 4a that are positioned at the outer side in the width direction are thicker than the electrode land portions 3b and 4b that are positioned at the inner side in the width direction. Therefore, even if the crystal element 9 of the crystal resonator 7 is subjected to bevel machining, it is possible to firmly join the crystal resonator 7 to the electrode lands 3 and 4 by the first conductive adhesive layer 5 and the second conductive adhesive layer 6. A modification in which a crystal resonator 7A whose crystal element 9 is subjected to bevel machining is described with reference to FIGS. 4 to 6.

Figure 4:
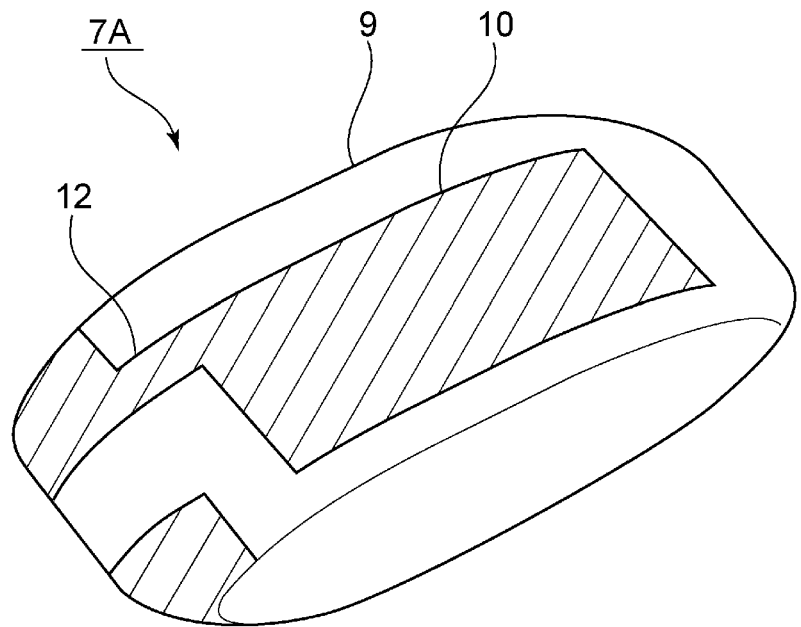
FIG. 4 is a perspective view of a crystal resonator according to a modification of the first embodiment of the present invention.

FIG. 4 is a perspective view of the crystal resonator 7A according to the modification. In the crystal resonator 7A, the crystal element 9 is subjected to bevel machining. Therefore, in the crystal element 9, in the length direction, the thickness is decreased from a central portion to each end portion in the length direction. Even in the width direction, the thickness is decreased from the center to each end portion in the width direction.

Except that the crystal element 9 is subjected to bevel machining, the crystal resonator 7A is the same as the crystal resonator 7.

Figure 5:
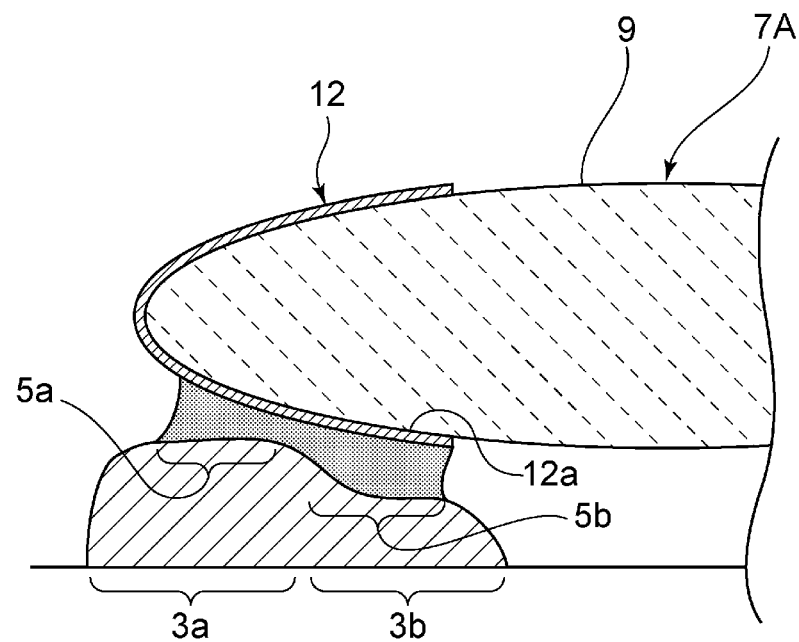
FIG. 5 is a schematic partial cutaway sectional view for illustrating a joined portion using the first conductive adhesive layer in a crystal vibrating device using the crystal resonator according to the modification shown in FIG. 4.

FIG. 5 is a schematic partial cutaway sectional view for illustrating a joined portion using a first conductive adhesive layer in a crystal vibrating device according to the modification in which the vibrator 7A is used. That is, FIG. 5 corresponds to FIG. 3 for the first embodiment.

Here, an electrode land portion 3a is thicker than an electrode land portion 3b. In addition, a change in a curve of a top surface from the electrode land portion 3a, formed by applying and solidifying conductive paste, towards the electrode land portion 3b occurs.

Figure 6:
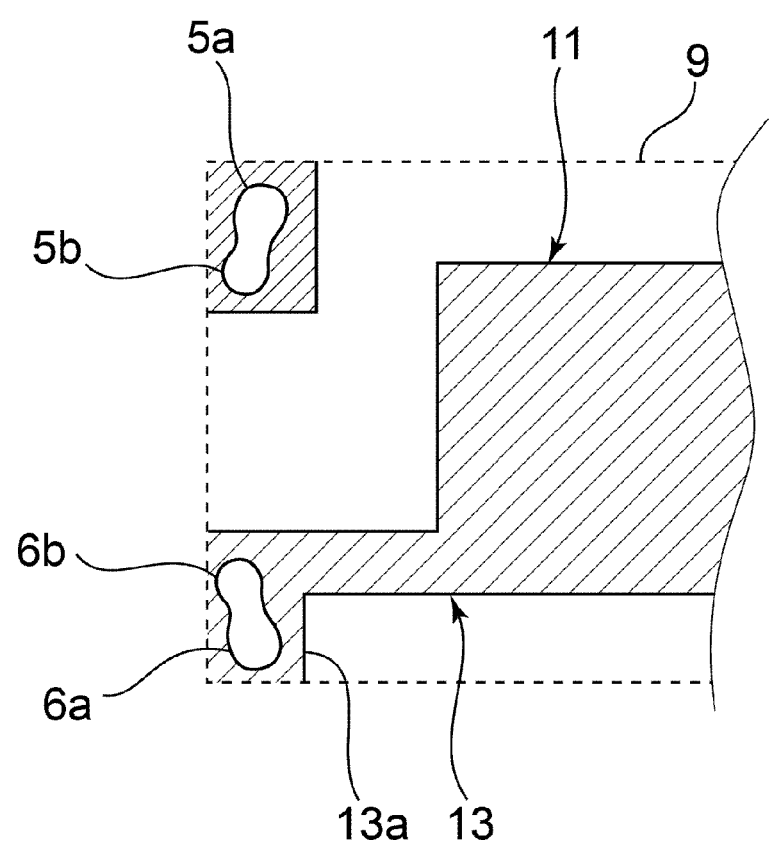
FIG. 6 is a schematic plan view showing, in a crystal vibrating device according to the modification shown in FIG. 4, electrode structures on a bottom surface of a crystal resonator and the relationship between the positions of first and second conductive adhesive layers when seeing through a crystal element from thereabove.

Conductive adhesive layer portions 5b and 6b that are applied at the inner side in the width direction are thicker than conductive adhesive layer portions 5a and 6a. In the modification, the conductive adhesive layer portions 5a and 5b are spread by a force generated when the crystal resonator 7A is joined, and are united with each other. Accordingly, the conductive adhesive layer portions 5a and 5b may be integrated with each other by contacting each other. FIG. 6 is a schematic plan view showing, in the crystal vibrating device according to the modification, the shapes of electrodes on a bottom surface of the crystal resonator, the relationship between the positions of the conductive adhesive layer portions, and planar shapes when seen through from thereabove. Although, as mentioned above, the conductive adhesive layer portion 5a and the conductive adhesive layer portion 5b are integrated with each other, the conductive adhesive layer portion 6a and the conductive adhesive layer portion 6b may similarly be united and integrated with each other.

As is clear from the planar shapes shown in FIG. 6, in the modification, there are neck portions having slightly smaller widths between the conductive adhesive layer portions 5a and 5b and the conductive adhesive layer portions 6a and 6b, the conductive adhesive layer portions 5a and 6a having relatively large areas and the conductive adhesive layer portions 5b and 6b having relatively smaller areas. Accordingly, in the shape formed by consecutively forming the conductive adhesive layer portion 5a and the conductive adhesive layer portion 5b, a portion where the width becomes smaller may be formed in the portion where they are consecutively formed.

In the crystal vibrating device according to the modification, the crystal resonator 7A subjected to bevel machining is used as mentioned above. In this case, the difference between the thickness at the center and the thickness at both sides in the width direction of the crystal resonator 7A may be absorbed by the difference in thickness between the electrode land portions 3a and 4a of the electrode lands 3 and 4 and the corresponding electrode land portions 3b and 4b of the electrode lands 3 and 4, and the difference in thickness between the conductive adhesive layer portions 5a and 6a and the corresponding conductive adhesive layer portions 5b and 6b. Therefore, it is possible to effectively further increase joining strength.

However, in the present invention, the thicknesses of the first and second electrode lands may be uniform.

Figure 7A:
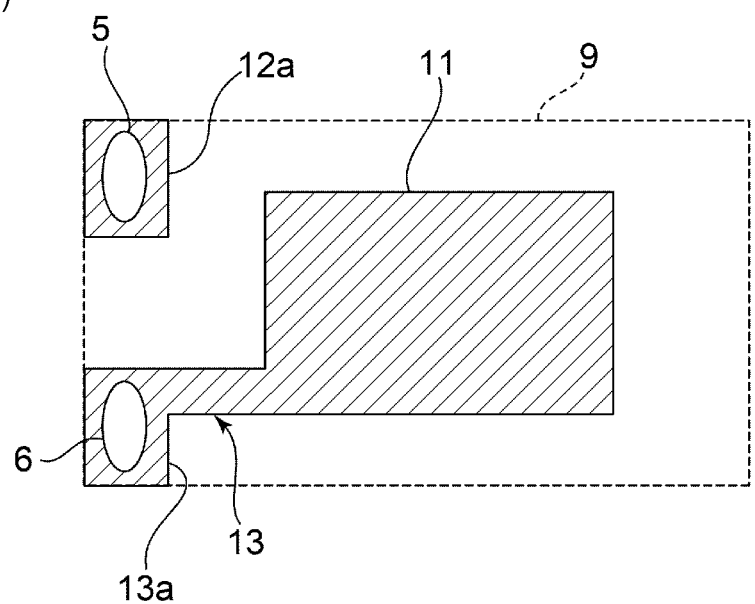
FIG. 7(a) and FIG. 7(b) are, respectively, a schematic plan view showing, in a crystal vibrating device according to a second embodiment of the present invention, the shapes of electrodes on a bottom surface of a crystal resonator and the relationship between the positions of conductive adhesive layers when seeing through a crystal element from thereabove, and a schematic view for illustrating the aspect ratios of the conductive adhesive layers.
Figure 7B:
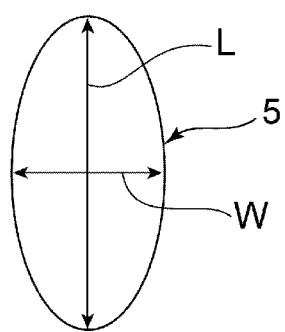

FIG. 7(a) and FIG. 7(b) are, respectively, a schematic plan view showing, in a crystal vibrating device according to a second embodiment of the present invention, the shapes of electrodes on a bottom surface of a crystal resonator and the relationship between the positions of conductive adhesive layers positioned below the electrodes when seeing through a crystal element from thereabove, and a schematic view for illustrating the aspect ratios of the conductive adhesive layers.

The second embodiment to a seventh embodiment below are the same as the first embodiment except for the shapes of electrodes on a bottom surface of a crystal resonator, the relationship between the positions of conductive adhesive layers, and the planar shapes of the conductive adhesive layers. Therefore, in the second embodiment to the seventh embodiment, portions having structures corresponding to those in the first embodiment are not described.

As shown in FIG. 7(a), in the second embodiment, as in the first embodiment, extended electrode portions 12a and 13a are positioned on the bottom surface of a crystal element 9. The second embodiment differs from the first embodiment in that the planar shape of the first conductive adhesive layer 5 and the planar shape of the second conductive adhesive layer 6 are shapes in which the aspect ratio is from 1.5 to 3.0. That is, in the second embodiment, the first conductive adhesive layer 5 has an oblong shape in the length direction. Here, a maximum size in the length direction is L, and a maximum size in the width direction that is orthogonal to the maximum size L is W. The aspect ratio is expressed by L/W. Although, in the second embodiment, the first conductive adhesive layer 5 has an oblong shape, the first conductive adhesive layer 5 may have other shapes in the length direction.

The second embodiment differs from the first embodiment in that the first conductive adhesive layer 5 and the second conductive adhesive layer 6 are each a single conductive adhesive layer. Therefore, the crystal element 9 is joined to a case substrate 2 at two locations. Even in this case, the aspect ratios of the first conductive adhesive layer 5 and the second conductive adhesive layer 6 are within the above-described particular range. Therefore, it is possible to effectively increase shock resistance. That is, the length direction of the first conductive adhesive layer 5 and the second conductive adhesive layer 6 whose aspect ratios are greater than or equal to 1.5 is along the width direction of the crystal element 9. Therefore, the crystal element 9 is firmly joined to the case substrate 2 by the first conductive adhesive layer 5 and the second conductive adhesive layer 6. When the aspect ratio is less than or equal to 3.0, the size of each adhesive layer along the length direction of the crystal element 9 becomes sufficient, so that, as expected, it is possible to effectively increase joining strength. Therefore, the aspect ratio is desirably from 1.5 to 3.0.

As described above, by using the first conductive adhesive layer 5 and the second conductive adhesive layer 6 whose aspect ratios are greater than or equal to 1.5, it is possible to sufficiently increase joining strength and to increase shock resistance. Therefore, even in the second embodiment, even if dropping shock is applied, changes in vibration frequency are less likely to occur. Since it is possible to increase joining strength, joining area need not be increased. Therefore, crystal impedance is less likely to increase.

Figure 8:
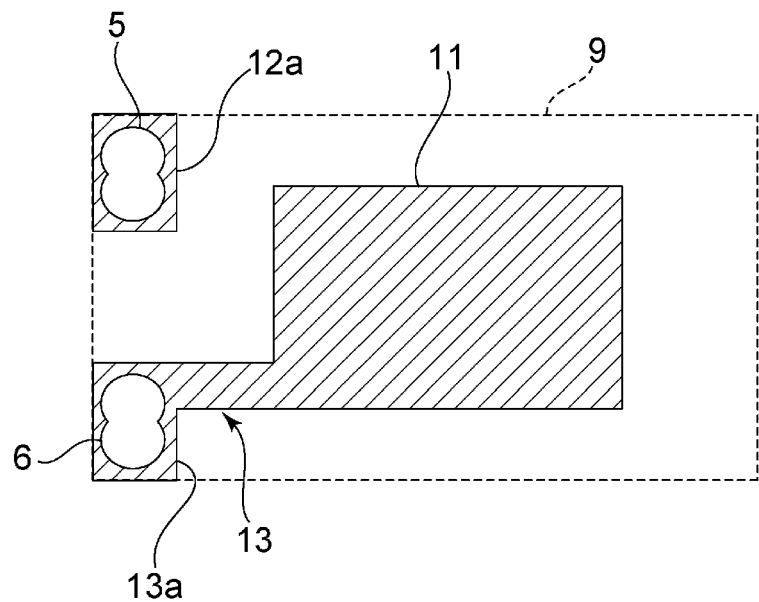
FIG. 8 is a schematic plan view showing, in a crystal vibrating device according to the third embodiment of the present invention, electrode structures on a bottom surface of a crystal resonator and the relationship between the positions of first and second conductive adhesive layers when seeing through a crystal element from thereabove.

FIG. 8 is a schematic plan view showing, in a crystal vibrating device according to the third embodiment of the present invention, the shapes of the electrodes on the bottom surface of a crystal element and the relationship between the positions of the first and second conductive adhesive layers when seeing through the crystal element from thereabove.

As shown in FIG. 8, in the third embodiment, when the conductive adhesive layers 5 and 6 are seen in plan view, each has a planar shape in which two circles are partly superimposed upon each other. In the third embodiment, the two circles are partly superimposed upon each other such that the centers of the two circles are at different positions in the width direction of the crystal element 9. However, the way in which the two circles are superimposed upon each other is not limited thereto.

The conductive adhesive layers 5 and 6 may each have a planar shape in which two ellipses instead of two circles are partly superimposed upon each other.

As in the third embodiment, when the first conductive adhesive layer 5 and the second conductive adhesive layer 6 are seen in plan view, they may each have a planar shape in which two circles or ellipses are partly superimposed upon each other. Even in these cases, it is possible to effectively increase joining strength provided by the first conductive adhesive layer 5 and the second conductive adhesive layer 6. Therefore, it is possible to increase shock resistance. Thus, even if, for example, dropping shock is applied, changes in vibration frequency are less likely to occur. In addition, since it is possible to increase joining strength, even in the embodiment, joining area need not be made large. Thus, crystal impedance is less likely to increase.

FIGS. 9 to 12 are each a schematic plan view showing, in a corresponding one of the fourth embodiment to the seventh embodiment of the present invention, extended electrode portions on the bottom surface of a crystal element and the relationship between the positions of the first and second conductive adhesive layers when seeing through the crystal element from thereabove.

Figure 9:
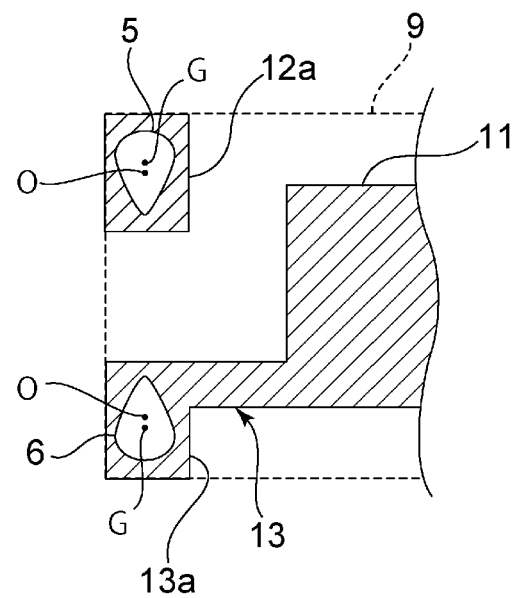
FIG. 9 is a schematic plan view showing, in a crystal vibrating device according to a fourth embodiment of the present invention, electrode structures on a bottom surface of a crystal resonator and the relationship between the positions of first and second conductive adhesive layers when seeing through a crystal element from thereabove.

In the fourth embodiment shown in FIG. 9, a center of gravity G in a plane of the first conductive adhesive layer 5 and a center of gravity G in a plane of the second conductive adhesive layer 6 are positioned outwardly in the width direction from a center O of the first conductive adhesive layer 5 and outwardly in the width direction from a center O of the second conductive adhesive layer 6. Here, the center O refers to the center in the width direction and the length direction. In this case, at a center side in the width direction, that is, at a side where propagation of vibration is strong, the amount of application of each of the first conductive adhesive layer 5 and the second conductive adhesive layer 6 is small. Therefore, it is possible to further reduce crystal impedance.

In the fourth embodiment, as in the second embodiment, the first conductive adhesive layer 5 and the second conductive adhesive layer 6 each have a shape whose aspect ratio is greater than or equal to 1.5 when seen in plan view. Therefore, as in the second embodiment, it is possible to increase joining strength.

Figure 10:
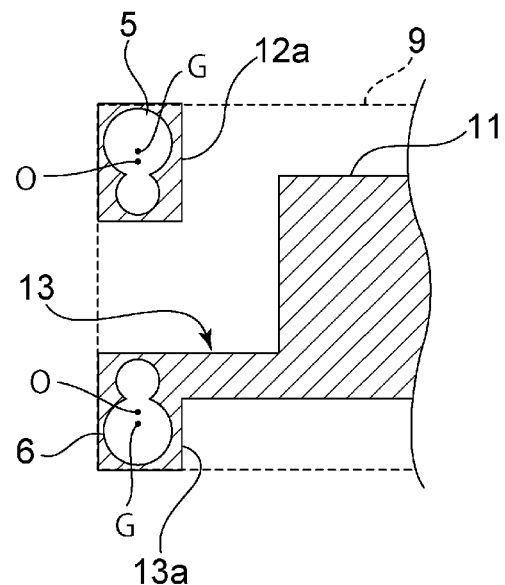
FIG. 10 is a schematic plan view showing, in a crystal vibrating device according to a fifth embodiment of the present invention, electrode structures on a bottom surface of a crystal resonator and the relationship between the positions of first and second conductive adhesive layers when seen through a crystal element from thereabove.

Even in the fifth embodiment shown in FIG. 10, a center of gravity G of the first conductive adhesive layer 5 and a center of gravity G of the second conductive adhesive layer 6 are positioned outwardly from a center O of the first conductive adhesive layer 5 and outwardly from a center O of the second conductive adhesive layer 6, respectively. Therefore, as in the fourth embodiment, it is possible to further reduce crystal impedance.

As is clear from the fourth and fifth embodiments, it is desirable that the center of gravity G of the first conductive adhesive layer 5 and the center of gravity G of the second conductive adhesive layer 6 be positioned outwardly from the center O of the first conductive adhesive layer 5 and outwardly from the center O of the second conductive adhesive layer 6. Such a structure is applicable even to the conductive adhesive layer 5 and the conductive adhesive layer 6 according to the first embodiment. However, in, for example, the conductive adhesive layer 5 shown in each of FIGS. 1 and 2, the conductive adhesive layer portion 5a and the conductive adhesive layer portion 5b are separated from each other in the width direction. In this case, at portions where the conductive adhesive layer portion 5a and the conductive adhesive layer portion 5b are provided, centers of gravity and centers may be defined as the centers of gravity G and the centers O on the basis of a figure that includes the conductive adhesive layer portion 5a and the conductive adhesive layer portion 5b. For example, in FIG. 2, such a figure that includes the layer portions 5a and 5b is formed by a line that connects both ends of the conductive adhesive layer portion 5a in the length direction of the crystal element 9, a line that connects both ends of the conductive adhesive layer portion 5b in the length direction, a curve of an outer peripheral edge situated at a portion at an outer side of the line of the conductive adhesive layer portion 5a, and a curve of an outer peripheral edge situated at a portion at an outer side of the line of the conductive adhesive layer portion 5b.

Even in the fifth embodiment, as in the third embodiment, when the first conductive adhesive layer 5 and the second conductive adhesive layer 6 are seen in plan view, they each have a planar shape in which two circles are partly superimposed upon each other. Therefore, even in the fifth embodiment, it is possible to effectively increase joining strength and shock resistance. Thus, even if, for example, dropping shock is applied, deterioration is less likely to occur in vibration characteristics.

Figure 11:
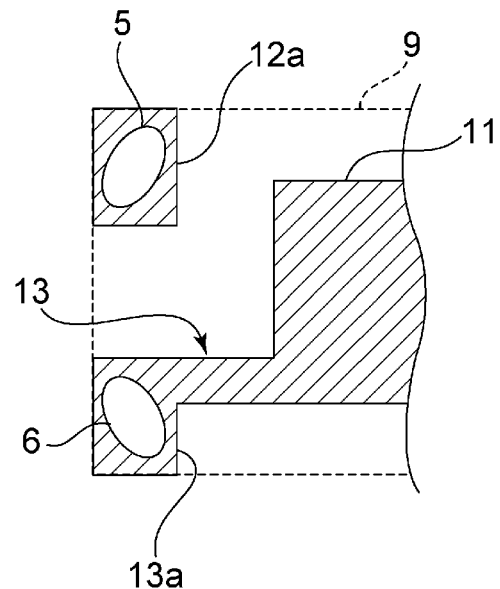
FIG. 11 is a schematic plan view showing, in a crystal vibrating device according to a sixth embodiment of the present invention, electrode structures on a bottom surface of a crystal resonator and the relationship between the positions of first and second conductive adhesive layers when seeing through a crystal element from thereabove.

In the sixth embodiment shown in FIG. 11, as in the second embodiment, the aspect ratios of the first conductive adhesive layer 5 and the second conductive adhesive layer 6 are within the range of 1.5 to 3.0. Therefore, since, as in the second embodiment, it is possible to increase joining strength, even if, for example, dropping shock is applied, deterioration is less likely to occur in vibration characteristics.

Further, in the sixth embodiment, the first conductive adhesive layer 5 and the second conductive adhesive layer 6 each have an elliptical shape. The elliptical shape extends from a short side where the crystal resonator 7 is supported towards the center side of the crystal element 9 from the inner side to the outer side in the width direction. Therefore, the short side where the crystal resonator 7 is supported may be such that, at the center in the width direction, that is, at a portion close to the center where propagation of vibration is strong, the amount of application of adhesive can be made relatively small. Therefore, it is possible to effectively reduce crystal impedance and to enhance vibration characteristics.

Figure 12:
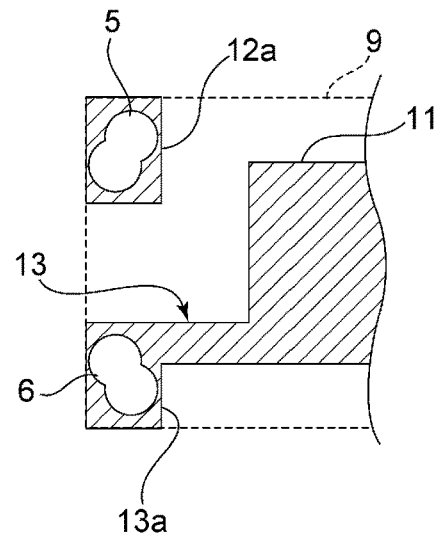
FIG. 12 is a schematic plan view showing, in a crystal vibrating device according to a seventh embodiment of the present invention, electrode structures on a bottom surface of a crystal resonator and the relationship between the positions of first and second conductive adhesive layers when seeing through a crystal element from thereabove.

Even in the seventh embodiment shown in FIG. 12, as in the sixth embodiment shown in FIG. 11, the first conductive adhesive layer 5 and the second conductive adhesive layer 6 extend away from the short side from the center towards the outer side in the width direction. Therefore, even in the embodiment, it is possible to effectively increase crystal impedance and to enhance vibration characteristics.

Even in the seventh embodiment, when the conductive adhesive layers 5 and 6 are seen in plan view, they each have a shape in which two circles are partly superimposed upon each other. Therefore, as in the third embodiment, it is possible to increase joining strength. Thus, since it is possible to increase shock resistance, even if, for example, dropping shock is applied, deterioration is less likely to occur in vibration characteristics.

In the crystal vibrating devices according to the first to the seventh embodiments, since the first conductive adhesive layer 5 and the second conductive adhesive layer 6 are formed as described above, even if, for example, dropping shock is applied, changes in vibration frequency are less likely to occur. Since the adhesion area need not be large, an increase in crystal impedance is less likely to occur. Such crystal vibrating devices may be manufactured by various methods. A manufacturing method is described below as an embodiment.

First, a package material like a case substrate 2 where a first electrode land 3 and a second electrode land 4 are formed on a crystal resonator mounting surface is prepared. A crystal resonator 7 including a crystal element 9, a first vibrating electrode 10 and a second vibrating electrode 11 that are provided on the crystal element 9, and a first extended electrode 12 and a second extended electrode 13 is prepared.

Extended electrode portions 12a and 13a of the crystal resonator 7 are joined to the first and second electrode lands 3 and 4 at the case substrate 2 by using the first conductive adhesive layer 5 and the second conductive adhesive layer 6. This causes the crystal resonator 7 to be mounted on the crystal resonator mounting surface of the case substrate 2 by the first conductive adhesive layer 5 and the second conductive adhesive layer 6.

In particular, it is desirable to apply conductive adhesives to two locations at portions of each of the first conductive adhesive layer 5 and the second conductive adhesive layer 6. By this, as mentioned above, it is possible to easily form the first conductive adhesive layer and the second conductive adhesive layer each having a planar shape in which two circles or ellipses are partly superimposed upon each other when seen in plan view. In this case, when applying conductive adhesives to two locations, it is possible to easily form the planar shapes in which two circles or ellipses are partly superimposed upon each other by bringing them close to each other.

Alternatively, when applying conductive adhesives to two locations, if they are provided away from each other, as described above, the first conductive adhesive layer 5 may be formed so as to include two conductive adhesive layer portions, that is, conductive adhesive layer portions 5a and 5b, and the second conductive adhesive layer 6 may be formed so as to include two conductive adhesive layer portions, that is, conductive adhesive layer portions 6a and 6b.

Further, when applying conductive adhesives to the aforementioned two locations, by adjusting the distance between the two locations, it is also possible to easily form the first conductive adhesive layer and the second conductive adhesive layer each having a planar shape whose aspect ratio is from 1.5 to 3.0.

The crystal vibrating device according to the present invention is not limited to one including the case substrate 2. The crystal vibrating device may include package materials having various shapes. For example, with an inside bottom surface of a package material having an upwardly extending cavity being a crystal resonator mounting surface, a package may be formed from the package material and a cover member.

Figure 13:
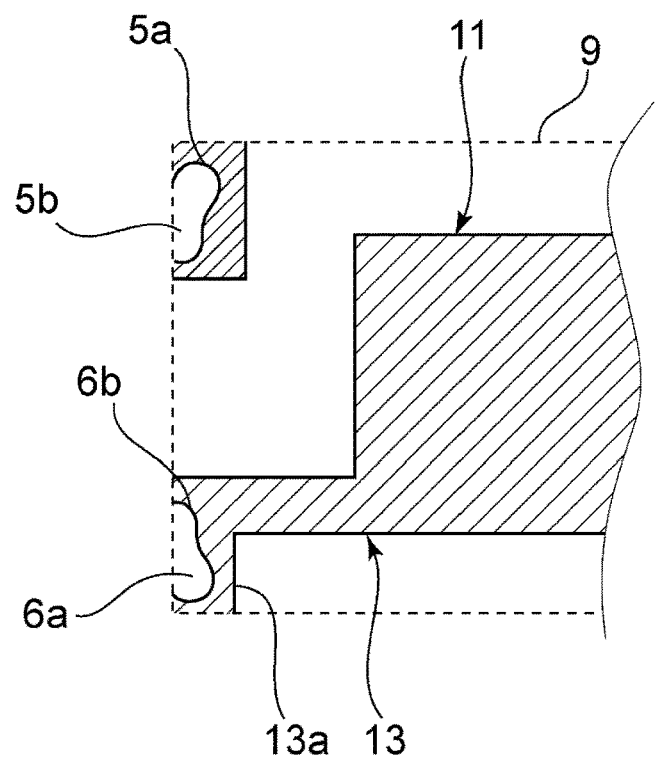
FIG. 13 is a schematic plan view showing electrode structures on a bottom surface of a crystal resonator and the relationship between the positions of first and second conductive adhesive layers when seeing through a crystal element from thereabove, FIG. 13 being provided for illustrating a modification of a structure for mounting a crystal resonator.

Although, in the above-described embodiments, the crystal resonator is mounted so as to cover the first and second conductive adhesive layers, the invention is not limited thereto. As shown in FIG. 13, the crystal resonator 7 may be mounted such that part of the first conductive adhesive layer 5 and part of the second conductive adhesive layer 6 protrude from an end portion of the crystal resonator 7.

REFERENCE SIGNS LIST 1 crystal vibrating device
2 case substrate
2a crystal resonator mounting surface
3, 4 first electrode land, second electrode land
3a, 3b, 4a, 4b electrode land portion
5, 6 first conductive adhesive layer, second conductive adhesive layer
5a, 5b, 6a, 6b conductive adhesive layer portion
7, 7A crystal resonator
8 cap member
9 crystal element
10, 11 first vibrating electrode, second vibrating electrode
12, 13 first extended electrode, second extended electrode
12a, 12b, 13a, 13b extended electrode portion

The invention claimed is:

1. A crystal vibrating device comprising:
a package material having a crystal resonator mounting surface;
a first electrode land and a second electrode land on the crystal resonator mounting surface of the package material;
a crystal resonator supported in a cantilever manner at the crystal resonator mounting surface of the package material, the crystal resonator including a crystal element, a first vibrating electrode and a second vibrating electrode on the crystal element, and a first extended electrode and a second extended electrode that extend from the first vibrating electrode and the second vibrating electrode, respectively; and
a first conductive adhesive layer and a second conductive adhesive layer that electrically connect and mechanically join the first extended electrode and the second extended electrode to the first electrode land and the second electrode land, respectively,
wherein, when the first conductive adhesive layer and the second conductive adhesive layer are viewed in a plan view, the first conductive adhesive layer and the second conductive adhesive layer each have a planar shape in which two circles or ellipses are partly superimposed upon each other,
wherein the crystal element has a shape of a rectangular plate having a pair of long sides and a pair of short sides, a direction in which the short sides extend is a width direction, and the crystal resonator is supported in the cantilever manner at one of the pair of short sides by the first conductive adhesive layer and the second conductive adhesive layer,
wherein a first center of gravity of the first conductive adhesive layer is positioned outwardly in the width direction from a center of the first conductive adhesive layer, and a second center of gravity of the second conductive adhesive layer is positioned outwardly in the width direction from a center of the second conductive adhesive layer, and
wherein the first electrode land and the second electrode land have a first thickness at an outer side thereof distal from a center of the crystal element and a second thickness at an inner side thereof proximal to the center of the crystal element, the first thickness being greater than the second thickness.

2. The crystal vibrating device according to claim 1, wherein the first conductive adhesive layer and the second conductive adhesive layer are elongated in a direction that extends from the short side towards a center of the crystal element.

3. The crystal vibrating device according to claim 1, wherein a first portion of the first conductive adhesive layer and a second portion of the second conductive adhesive layer are directly joined to a surface of the crystal element.

4. The crystal vibrating device according to claim 1, wherein the first conductive adhesive layer and the second conductive adhesive layer are each formed of epoxy resin and a conductive material.

5. A crystal vibrating device comprising:
a package material having a crystal resonator mounting surface;
a first electrode land and a second electrode land on the crystal resonator mounting surface of the package material;
a crystal resonator supported in a cantilever manner at the crystal resonator mounting surface of the package material, the crystal resonator including a crystal element, a first vibrating electrode and a second vibrating electrode on the crystal element, and a first extended electrode and a second extended electrode that extend from the first vibrating electrode and the second vibrating electrode, respectively; and
a first conductive adhesive layer and a second conductive adhesive layer that electrically connect and mechanically join the first extended electrode and the second extended electrode to the first electrode land and the second electrode land, respectively,
wherein the first conductive adhesive layer and the second conductive adhesive layer each include two conductive adhesive layer portions that are separated from each other,
wherein the crystal element has a shape of a rectangular plate having a pair of long sides and a pair of short sides, a direction in which the short sides extend is a width direction, and the crystal resonator is supported in the cantilever manner at one of the pair of short sides by the first conductive adhesive layer and the second conductive adhesive layer,
wherein a first center of gravity of the first conductive adhesive layer is positioned outwardly in the width direction from a center of the first conductive adhesive layer, and a second center of gravity of the second conductive adhesive layer is positioned outwardly in the width direction from a center of the second conductive adhesive layer, and
wherein the first electrode land and the second electrode land have a first thickness at an outer side thereof distal from a center of the crystal element and a second thickness at an inner side thereof proximal to the center of the crystal element, the first thickness being greater than the second thickness.

6. The crystal vibrating device according to claim 5, wherein the first conductive adhesive layer and the second conductive adhesive layer are elongated in a direction that extends from the short side towards a center of the crystal element.

7. The crystal vibrating device according to claim 5, wherein a first portion of the first conductive adhesive layer and a second portion of the second conductive adhesive layer are directly joined to a surface of the crystal element.

8. The crystal vibrating device according to claim 5, wherein the first conductive adhesive layer and the second conductive adhesive layer are each formed of epoxy resin and a conductive material.

9. The crystal vibrating device according to claim 1, wherein the first conductive adhesive layer and the second conductive adhesive layer each have a length direction and each have an aspect ratio, which is a ratio between a maximum size in the length direction and a maximum size in a width direction that is orthogonal to the maximum size in the length direction, in a range of 1.5 to 3.0.

10. The crystal vibrating device according to claim 5, wherein the first conductive adhesive layer and the second conductive adhesive layer each have a length direction and each have an aspect ratio, which is a ratio between a maximum size in the length direction and a maximum size in a width direction that is orthogonal to the maximum size in the length direction, in a range of 1.5 to 3.0.

* * * * *